United States Patent [19]

Kobayashi

[11] Patent Number: 4,877,936
[45] Date of Patent: Oct. 31, 1989

[54] SOLDERED STRUCTURE OF FINE WIRE, AND METHOD OF AND APPARATUS FOR SOLDERING FINE WIRE

[75] Inventor: Jyunichi Kobayashi, Sakkura, Japan

[73] Assignee: Hitachi, Ltd., Tokyo, Japan

[21] Appl. No.: 109,166

[22] Filed: Oct. 16, 1987

[30] Foreign Application Priority Data

Oct. 17, 1986 [JP] Japan .................................. 61-245201

[51] Int. Cl.$^4$ ................................................ B23K 1/00
[52] U.S. Cl. .................................. 219/85.22; 219/85.18
[58] Field of Search ................ 219/85 R, 85 M, 85 F, 219/56.1, 56.21, 56.22, 234

[56] References Cited

U.S. PATENT DOCUMENTS

| | | | |
|---|---|---|---|
| 3,381,081 | 4/1968 | Schalliol | 219/234 |
| 3,944,777 | 3/1976 | Porat | 219/85 F |
| 3,972,463 | 8/1976 | Conlon et al. | 219/85 M |
| 4,484,054 | 11/1984 | Morino | 219/85 F |

Primary Examiner—Clifford C. Shaw
Attorney, Agent, or Firm—Fay, Sharpe, Beall, Fagan, Minnich & McKee

[57] ABSTRACT

A fine wire whose conductor has a diameter of 100 μm or less is welded on a conductor pattern. A part of the fine wire is formed into an exposed joint portion which is exposed out of a solder, but a part thereof which is nearer to an electric component than the exposed joint portion is buried in the solder layer.

18 Claims, 4 Drawing Sheets

SOLDERED STRUCTURE OF FINE WIRE, AND METHOD OF AND APPARATUS FOR SOLDERING FINE WIRE

BACKGROUND OF THE INVENTION:

1. Field of the Invention:

The present invention relates to a structure in which a fine wire being the lead of an electric component, particularly a fine wire having a conductor diameter of or below 100 μm is soldered on a conductor pattern. It also relates to a method of soldering the fine wire, and an apparatus therefor.

2. Description of the Prior Art:

In connecting a conductor pattern on the substrate of an electric component and an insulator-coated fine wire the core conductor of which has a diameter of 100 μm or so and the surface of which is treated with a synthetic resin, there has heretofore been often employed a method wherein as illustrated in FIG. 9, the insulator-coated fine wire 3 is arranged on the conductor pattern 1 previously formed with a solder layer 2 about 5 μm thick, and the core wire 4 of the insulator-coated fine wire 3 is thereafter connected by reflowing through Joule heat generated in such a way that a resistor tip 6 depressed on the upper side of the fine wire 3 is energized by a welding source 7. On this occasion, the synthetic-resin insulating coating 5a of the insulator-coated fine wire 3 is melted or vaporized off by the heat generation of the resistor tip 6, and only the core wire 4 is welded into the solder layer 2 as shown in FIG. 10. A plan view of the external appearance of the parts connected as described above, is shown in FIG. 11. Symbol 5b denotes the solidified residue of the synthetic-resin insulating coating which has been melted at the stage of the reflowing connection.

Relevant to the joining method of this type are techniques disclosed in Japanese Patent Application Publication No. 15856/1970, Japanese Patent Application Laid-open No. 210694/1982 and Japanese Patent Application Laid-open No. 134491/1985.

The prior art stated above is chiefly directed toward the connection of the insulator-coated fine wires whose conductors have diameters larger than 100 μm. It does not take into consideration a fine wire whose conductor has a diameter of or below 100 μm, and it has posed such a problem that the bonding strength of the connected portion lowers due to the deformation or damage of the ultra-fine wire ascribable to the pressure application of the resistor chip. For this reason, the ultra-fine wire has hitherto been manually joined with a solder and by a soldering iron. The manual microscopic joining operations, however, require the aptitude and skill of an operator and have necessitated a large number of man-hours. Further, the manual operations have been problematic as to reliability.

SUMMARY OF THE INVENTION:

An object of the present invention is to provide a structure and method in which the aforementioned fine wire (ultra-fine wire) whose conductor has the diameter of or below 100 μm, especially of approximately 30-50 μm, is reliably soldered on a conductor pattern formed with a solder layer.

The object is accomplished by a structure comprising an exposed joint portion in which a fine wire is exposed out of a solder but is joined with a pattern, and one or more burying portions in which the fine wire is buried in the solder, at least one of the burying portions being located nearer to an electric component than the exposed joint portion.

In addition, such a soldered structure is fabricated by a method in which a solder layer whose thickness is 1.5–2.5 times, desirably 1.8–2.2 times a diameter of the fine wire (having a conductor diameter of 100 μm or less, especially of approximately 20 μm–50 μm) is formed on the conductor pattern, the fine wire is placed on the solder layer, and the fine wire is heated and pressed on the solder layer and at a position more remoter from the electric component than an end of the solder layer on an electric component side thereof, thereby to be soldered.

A method can be readily performed by the use of a jig comprising a fine-wire supporting device having an open portion in at least a part thereof to oppose the conductor pattern and for supporting the fine wire and bringing it into opposition to the conductor pattern. At least one of the fine-wire supporting devices and the conductor pattern is moved so as to establish a state in which the fine wire opposes the conductor pattern and a state in which it does not oppose thereto. Heat and pressure are applied for heating the fine wire and pressing it against the conductor pattern while facing the fine wire through the open portion.

In a case where a fine wire has an insulating coating, this synthetic-resin insulating coating is first vaporized off by the generation of heat of a resistor tip based on the conduction of current. Secondly, when the heat is transferred through the core wire of the fine wire to a solder layer overlying a pattern, the solder layer is caused to reflow from the center of a pressed area to both sides thereof in the lengthwise direction of the pattern as a preset conduction time lapses. Then, the connection of the fine wire is completed.

The upper part of the core wire of the insulator-coated wire is exposed in the area heated and pressed by the resistor tip, but the coated wire is buried in the solder layer on both the sides of the area or on at least the side nearer to an electric component than the exposed joint portion. On this occasion, the synthetic-resin insulating coating is melted and peeled off by the reflowing of the solder layer. The melted and peeled parts of the synthetic-resin insulating coating move to both outer sides with the reflowing, and they become residue and solidify on the outer sides of the portion in which the core wire is buried in the solder layer. As described above, the core wire of the insulator-coated wire is buried in the solder layer on both sides of the area pressed by the resistor tip or on at least the side nearer to the electric component, so that the bonding strength of the connection can be prevented from lowering due to the deformation or damage of the core wire attendant upon the pressure application of the resistor tip. Further, when the fine wire is coated with the synthetic resin, the core wire is surrounded with the synthetic-resin insulating coating residue which is more flexible than the solder, on the outer side of the portion in which the core wire is buried in the solder layer, and hence, the disconnection of the fine wire can be prevented. Moreover, since the upper part of the core wire of the insulator-coated wire is exposed in the area pressed by the resistor tip, the connection can be easily inspected, whether or not the connection is perfectly done.

The reasons why the thickness m of the solder layer is restricted to 1.5–2.5 times the diameter d of the core wire follow. When the solder layer is thinner than 1.5 times, a stable burying portion is not attained. On the other hand, when the layer is thicker than 2.5 times, the solder forms beads to scatter, or it protrudes beyond the width of the pattern to short-circuit this pattern with an adjacent pattern. A stable exposed joint portion is not attained, either. Experiments produced substantially satisfactory results in the range specified above, and have revealed that a range of 1.8–2.2 times is more desirable.

BRIEF DESCRIPTION OF THE DRAWINGS:

FIGS. 9 thru 11 illustrate a prior art, wherein FIG. 9 is a schematic view showing a state in which a resistor tip for heating and pressing a wire is energized by a welding source, FIG. 10 is a sectional view taken along plane A—A in FIG. 11, and FIG. 11 is a plan view showing the connected state of the insulator-coated wire hitherto practised.

Figure 1:
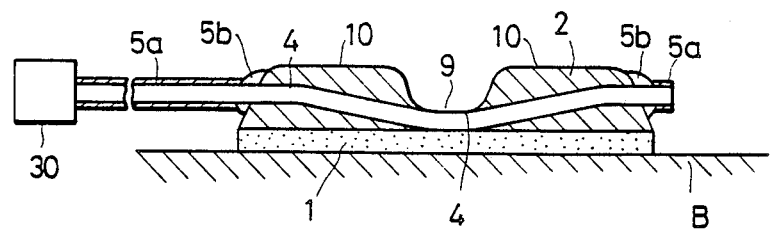
FIG. 1 is a vertical sectional view of a soldered structure in an embodiment of the present invention.
Figure 3:
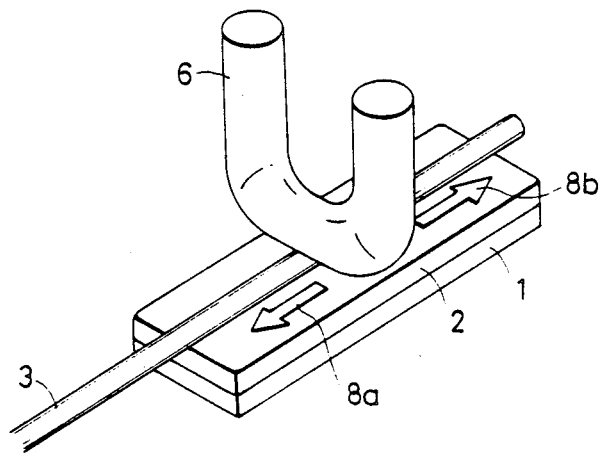
FIG. 3 is a view showing the initial state of the embodiment in FIG. 1.
Figure 5:
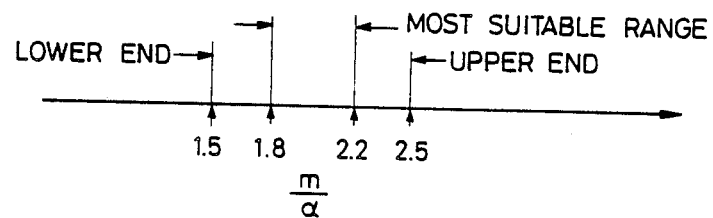
FIG. 5 is a graphical representation showing the desirable range of thicknesses of a solder layer relative to the diameter of a core conductor wire.

DESCRIPTION OF THE PREFERRED EMBODIMENTS:

Now, an embodiment of the present invention will be described with reference to the drawings. FIG. 1 is a sectional view of a soldered structure embodying the present invention. The embodiment is constructed of a pattern 1 on a substrate or base plate B, a solder layer 2, the core wire or conductor 4 of an insulator-coated wire, the synthetic-resin insulating coating 5a of the insulator-coated wire, the solidified residue 5b of the synthetic-resin insulating coating melted and peeled off during soldering, an area 9 pressed by a resistor tip (6 in FIG. 3), and a burying portion 10 in which the core wire 4 is buried in the solder layer. Core wire 4 is formed in a shallow V-shape with straight horizontal portions on both sides of said V-shape. Bent portions are formed between said shallow V-shape and said straight horizontal portion. FIG. 3 is a view of the initial state of the embodiment of the present invention illustrated in FIG. 1. The pattern 1 which has a lengthwise component of approximately 1.0–2.0 mm on the substrate (not shown in FIG. 3), is formed with the solder layer 2 whose thickness m is 1.5–2.5 times, desirably 1.8–2.2 times as great as the diameter d of the core wire of the insulator-coated wire 3 to be connected, as indicated in FIG. 5. The enamel-coated wire 3 is placed on the resulting pattern so as to extend over the pattern in the longitudinal direction thereof, whereupon the resistor tip 6 is caused to abut on the middle position of the pattern in the longitudinal direction thereof so as to apply a pressure and to conduct current. Then, owing to the generation of heat of the resistor tip 6, the synthetic-resin insulating coating in that area of the insulator-coated wire 3 which has been pressed by the resistor tip 6 is first vaporized off. Subsequently, when the heat is transferred to the solder layer 2 on the pattern 1 through the core wire 4, this solder layer reflows from the center of the pressed area to both the sides thereof in the longitudinal direction of the pattern as indicated by arrows 8a and 8b.

Figure 2:
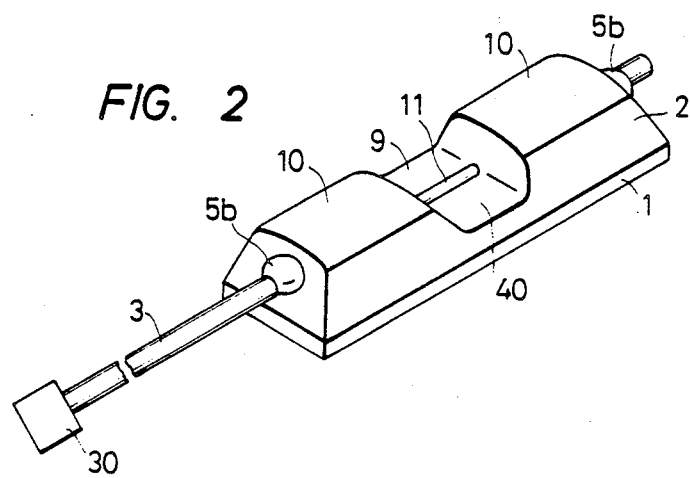
FIG. 2 is an exterior perspective view corresponding to FIG. 1.
Figure 4:
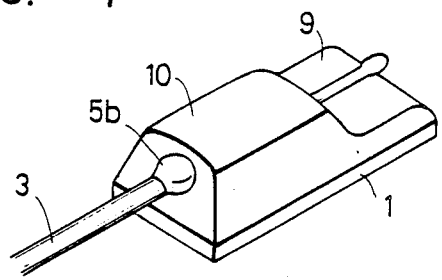
FIG. 4 is an exterior perspective view showing another embodiment of the present invention.

On this occasion, as shown in an exterior perspective view of FIG. 2, in the area 9 pressed by the resistor tip 6, the core wire 4 of the insulator-coated wire 3 is depressed by the preset pressure of the resistor tip 6 and is fastened in the melted solder layer 2 to the extent of a width equal to the diameter of the core wire on the pattern 1. In contrast, the upper part 11 of the core wire 4 is exposed out of the solder layer. This part is an exposed joint portion 40. In addition, in the burying portions 10 on both sides of the exposed joint portion 40, the synthetic-resin insulating coating 5a of the insulator-coated wire 3 is melted and peeled off owing to the appropriate amount of the solder (the solder thickness which is 1.5–2.5 times the diameter of the core wire), so that the core wire 4 is buried in the solder layer 2. By the way, the melted and peeled parts of the synthetic-resin insulating coating 5a move toward both the outer sides of the burying portions 10 as the solder layer 2 reflows, and they become the residue parts 5b and solidify on the outer sides of the burying portions 10 in which the core wire 4 is buried in the solder layer. According to the embodiment thus far described, the lowering of the bonding strength of the connection attributed to the deformation or damage of the core wire 4 attendant upon the pressure application of the resistor tip 6 can be prevented by the burying portions 10 which lie on both the sides of the pressed area 9 and in which the core wire 4 of the insulator-coated wire 3 is buried in the solder layer. Further, on the outer side of each burying portion 10, the disconnection of the wire can be prevented because the side part is surrounded with the synthetic-resin insulating coating residue 5b which is more flexible than the solder. As another effect, since the upper part 11 of the core wire 4 of the insulator-coated wire 3 is exposed in the area 9 pressed by the resistor tip 6, it can be seen if the connection is perfect. FIG. 4 shows another embodiment of the present invention. In this embodiment, the pressed area 9 is set in the vicinity of the end of the pattern 1 on an opposite side to a side from which the insulator-coated wire 3 is led. Thus, this embodiment produces besides the aforementioned effects, the effect that the lengthwise component of the pattern 1 can be shortened. In FIGS. 1 and 2, numeral 30 designates an electric component from which the insulator-coated wire 30 is led.

Figure 6:
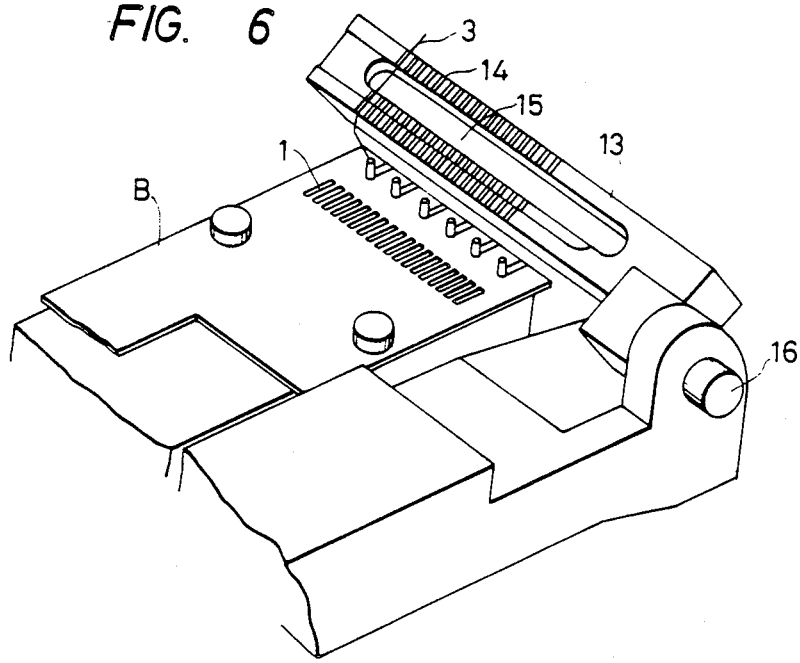
FIG. 6 is an exterior perspective view of an adhesion type or suction type apparatus for positioning and keeping an insulator-coated wire in an embodiment of the present invention.

FIG. 6 is an exterior perspective view of an apparatus for positioning and keeping insulator-coated wires in an embodiment of the present invention. Numeral 13 indicates fine-wire supporting device, which has guide grooves 14 and an open portion 15 provided in the middle of the guide grooves. Shown at numeral 16 is a rotary shaft for throwing down the fine-wire supporting device 13 to the position of a pattern 1 on a substrate B.

Figure 7:
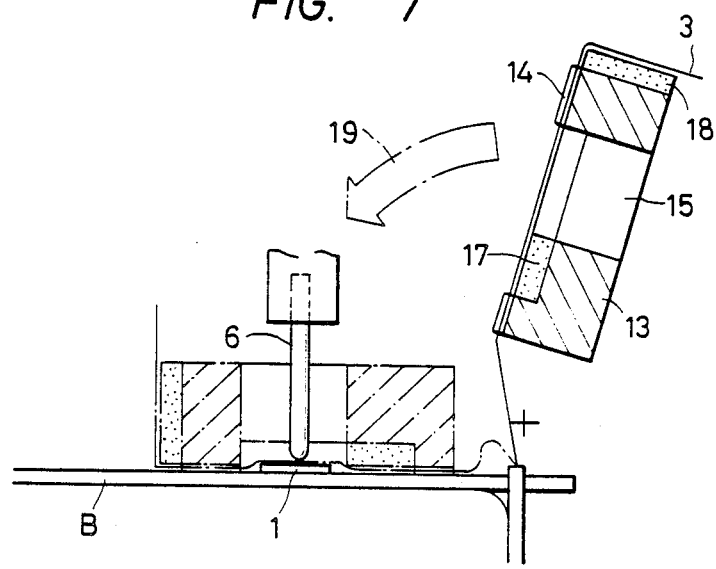
FIGS. 7 and 8 are sectional views of the essential portions of the embodiment shown in FIG. 6.
Figure 8:
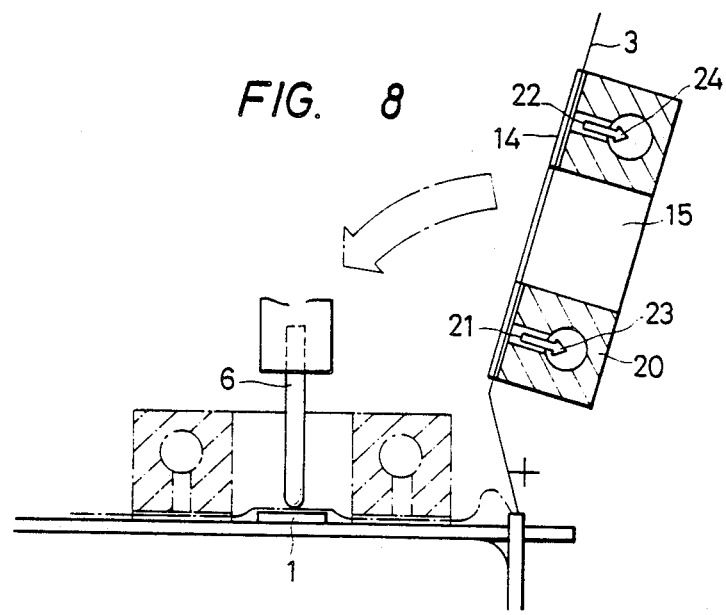
Figure 9:
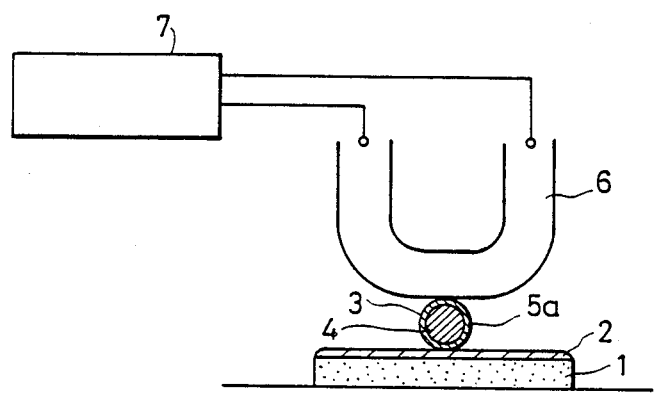
Figure 10:
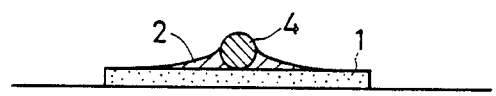
Figure 11:
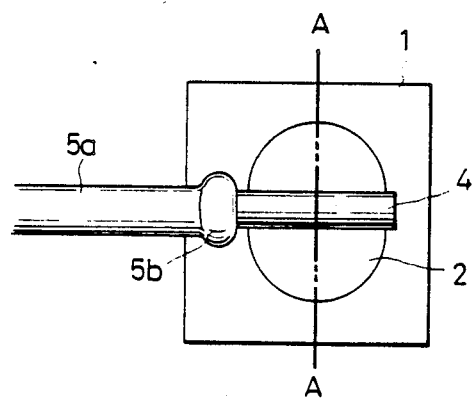

The guide grooves 14 are formed at positions corresponding to the pattern 1, and the open portion 15 is arranged so as to overlie the patterns 1 when the supporting device 13 is thrown down on the patterns about the rotary shaft 16. FIG. 7 shows an embodiment of the present invention, and is a sectional view of essential portions in FIG. 6. When the insulator-coated wires 3 are arranged in the guide grooves 14 one by one, they are tentatively fastened and held by adhesion layers 17 and 18. On this occasion, in the middle open portion 15, the insulator-coated wires 3 are exposed and are tightened by the adhesion layers 17 and 18. Under this state, the supporting device 13 is brought down in a rotary direction indicated by arrow 19. Thus, the insulator-coated wires 3 can be positioned in close contact with the patterns 1 on the substrate B. FIG. 8 shows another embodiment of the present invention. In this embodiment, the tentative fastening and holding of the insulator-coated wires 3 by the adhesion layers 17 and 18 in the foregoing embodiment of FIG. 7 is replaced with tentative fastening and holding by vacuum suction owing to vacuum suction holes 21 and 22. This embodiment has the advantage that, after the step of reflowing connection, positioning means 20 can be easily detached by stopping the vacuum suction. The adhesive forces of the adhesion layers 17 and 18 in FIG. 7 must be such that the insulator-coated wire 3 can be drawn away by a force which is not greater than ⅓ of the tensile strength of the wire 3. This condition is intended to prevent the breakage of the insulator-coated wire 3 when the positioning means 13 is detached. The embodiments stated above produce the effect that the insulator-coated wires 3 can be readily positioned into contact with the patterns 1 on the substrate B.

I claim:

1. A soldered structure, comprising:
    a fine wire of an electric component;
    a conductor pattern disposed so as to extend along an extending direction of said fine wire;
    a solder layer disposed on said conductor pattern;
    an exposed joint portion wherein said fine wire is joined with said conductor pattern and wherein said fine wire is exposed out of said solder layer; and
    a burying portion adjacent said exposed joint portion along the extending direction of said fine wire wherein said fine wire is buried in said solder layer, said fine wire leading out from said burying portion with insulation thereon to said electric component opposite to a side of said burying portion adjacent to said exposed joint portion and said fine wire leading out from said burying portion at said adjacent side without insulation thereon said exposed joint portion.

2. A soldered structure according to claim 1, wherein said solder layer is within the range of 1.5 to 2.5 times the diameter of the conductor of said fine wire.

3. A soldered structure according to claim 1, wherein said solder layer is within the range of 1.8 to 2.2 times the diameter of the conductor of said fine wire.

4. A soldered structure, according to claim 1, wherein said fine wire includes a solidified residue of insulating coating around the conductor of said fine wire, contacting said soldered layer around the entire periphery of said conductor; an insulating coating around the entire periphery of said conductor completely between said solidified residue and said electric component; and said conductor being directly bonded to said solder within said burying portion and on its side adjacent said conductor pattern in said exposed joint portion, and being exposed to the environment in said exposed joint portion on the side opposite said conductor pattern.

5. A soldered structure according to claim 1, wherein said fine wire has a conductor diameter of approximately 30 to 50 micrometers.

6. A soldered structure according to claim 1, wherein said fine wire has a downward sloped portion and a straight horizontal portion at the upper end of said sloped portion and a bent portion between said sloped portion and said straight horizontal portion, said exposed joint portion is formed at the lower part of said sloped portion, and said burying portion is disposed so as to bury said bent portion in said solder layer.

7. A soldered structure, comprising:
    a fine wire of an electric component;
    a conductor pattern disposed so as to extend along an extending direction of said fine wire;
    a solder layer disposed on said conductor pattern;
    an exposed joint portion wherein said fine wire is joined with said conducting pattern and said fine wire is exposed out of said solder layer; and
    two burying portions adjacent respective sides of said exposed joint portion along the extending direction of said fine wire wherein said fine wire is buried in said solder layer, said fine wire leading out from one of said buried portions with insulation thereon to said electric component disposed on one side of said burying portion opposite to said exposed joint portion and further leading out from said buried portion at another side to said exposed joint portion.

8. A soldered structure according to claim 7, wherein said fine wire includes a solidified residue of insulating coating around the conductor of said fine wire, contacting said soldered layer around the entire periphery of said conductor; an insulating coating around the entire periphery of said conductor completely between said solidified residue and said electric component; and said conductor being directly bonded to said solder within said burying portion and on its side adjacent said conductor pattern in said exposed joint portion, and being exposed to the environment in said exposed joint portion on the side opposite said conductor pattern.

9. A soldered structure according to claim 7, wherein said solder layer is within the range of 1.5 to 2.5 times the diameter of the conductor of said fine wire.

10. A soldered structure according to claim 7, wherein said solder layer is within the range of 1.8 to 2.2 times the diameter of the conductor of said fine wire.

11. A soldered structure according to claim 7, wherein said fine wire has a terminal end extending straight outwardly beyond said one of said buried portion sides opposite from the exposed joint portion; and
    said terminal end of said fine wire being surrounded by a solidified residue of insulating coating immediately adjacent said solder layer and contacting said solder layer.

12. A soldered structure according to claim 7, wherein said fine wire has a conductor diameter of approximately 30 to 50 micrometers.

13. A soldered structure according to claim 7, wherein said fine wire is formed in a shallow V-shape and has straight horizontal portions on both sides of said V-shape and bent portions between said shallow V-shape and said straight horizontal portions, said exposed joint portion is formed at the bottom of said V-shape and said burying portions are disposed so as to bury said bent portions in said solder layer.

14. A method of soldering a fine wire onto a conductor pattern, comprising:

disposing a solder layer on said conductor pattern;

disposing a fine wire with insulating coating on a surface of said solder layer in the longitudinal direction of said conductor pattern;

disposing a resistor tip above said fine wire in such a manner that said resistor tip is applied to said solder layer perpendicularly to the longitudinal direction of said conductor pattern;

abutting said resistor tip on said fine wire in the longitudinal direction thereof;

applying a pressure to said resistor tip and heating said resistor tip so as to press said fine wire towards said conductor pattern for melting said insulating coating so as to form an exposed joint portion and for forming burying portions to bury a part of said fine wire in said solder layer;

removing said resistor tip from said exposed joint portion where said fine wire is exposed out of said solder layer.

15. A method of soldering a fine wire according to claim 14, wherein said exposed joint portion is formed in the middle of said conductor pattern, whereby two burying portions are formed on both sides of said exposed joint portion.

16. A method of soldering a fine wire according to claim 15, wherein said fine wire is formed in a shallow V-shape and has straight horizontal portions on both sides of said V-shape and bent portions between said shallow V-shape and said straight horizontal portions, said exposed joint portion is formed at the bottom of said V-shape and said burying portions are disposed so as to bury said bent portions in said solder layer.

17. A method of soldering a fine wire according to claim 14, wherein said exposed joint portion is formed on one end portion of said conductor pattern, whereby a burying portion and an exposed portion are formed on said conductor pattern.

18. A method of soldering a fine wire according to claim 17, wherein said fine wire has a downward sloped portion and a straight horizontal portion at the upper end of said sloped portion and a bent portion between said sloped portion and said straight horizontal portion, said exposed joint portion is formed at the lower part of said sloped portion, and said burying portion is disposed so as to bury said bent portion in said solder layer.

* * * * *